United States Patent [19]

Foster et al.

[11] Patent Number: 5,575,856
[45] Date of Patent: Nov. 19, 1996

[54] THERMAL CYCLE RESISTANT SEAL AND METHOD OF SEALING FOR USE WITH SEMICONDUCTOR WAFER PROCESSING APPARATUS

[75] Inventors: Robert F. Foster, Phoenix; Brian Shekerjian, Tempe; Joseph T. Hillman, Scottsdale, all of Ariz.

[73] Assignees: Sony Corporation, Tokyo, Japan; Materials Research Corporation, Orangeburg, N.Y.

[21] Appl. No.: 241,192

[22] Filed: May 11, 1994

[51] Int. Cl.$^6$ ............................. B21F 41/00; C23C 16/00
[52] U.S. Cl. ........................................ 118/733; 29/25.01
[58] Field of Search ..................... 118/715, 725, 118/733; 285/910; 29/25.01

[56] References Cited

U.S. PATENT DOCUMENTS

| | | | |
|---|---|---|---|
| 1,884,551 | 10/1932 | Boynton | 285/910 |
| 2,029,606 | 2/1936 | Bredtschneider | 285/910 |
| 4,020,864 | 5/1977 | Church, Jr. | 137/242 |
| 4,381,868 | 5/1983 | Croy et al. | 277/27 |
| 4,441,726 | 4/1984 | Uhl | 277/230 |
| 4,448,000 | 5/1984 | Manuccia et al. | |
| 4,455,040 | 6/1984 | Shinn | 285/142 |
| 4,539,933 | 9/1985 | Campbell et al. | |
| 4,857,704 | 8/1989 | Jannot et al. | |
| 4,911,480 | 3/1990 | Bridges et al. | 285/910 |
| 5,017,024 | 5/1991 | Clark et al. | 384/482 |
| 5,060,108 | 10/1991 | Baker et al. | 361/283 |
| 5,207,573 | 5/1993 | Miyagi et al. | |
| 5,209,522 | 5/1993 | Reaux | 285/910 |
| 5,253,324 | 10/1993 | Wortman et al. | |
| 5,273,588 | 12/1993 | Foster et al. | 118/723 E |
| 5,368,648 | 11/1994 | Sekizuka | 118/733 |

FOREIGN PATENT DOCUMENTS

| | | |
|---|---|---|
| 0104764 | 4/1984 | European Pat. Off. . |
| 0303030 | 2/1989 | European Pat. Off. . |
| 55-139555 | 1/1981 | Japan . |
| 55-122871 | 9/1990 | Japan . |
| 4145638 | 5/1992 | Japan . |
| 5-149433A | 6/1993 | Japan . |
| 05149433 | 10/1993 | Japan . |

OTHER PUBLICATIONS

K. Trutnovsky "Beruhrungsdichtungen An Ruhenden Bewegten Maschinenteilen" 1975, Springer–Verlag Berlin Heidelberg New York, Berlin.

Editors of the Trade and Technical Press Limited "Seals and Sealing Handbook" 1986, The Trade and Technical press Limited, Morden GB.

Editors of the Trade and Technical Press Ltd., *Seals and Sealing Handbook*, pp. 64–65, 1986.

Primary Examiner—Mary Wilczewski
Assistant Examiner—Brian K. Dutton
Attorney, Agent, or Firm—Wood, Herron & Evans

[57] ABSTRACT

A semi conductor wafer processing apparatus has a wafer supporting susceptor having a sealing surface, a susceptor drive shaft for connection to the susceptor also having a sealing surface, a seal disposed between the susceptor and drive shaft sealing surfaces having a rigid metallic core and a ductile metallic coating on the core, and fasteners connecting the susceptor to the drive shaft and compressing the seal between the susceptor and drive shaft sealing surfaces. The seal retains sealing capability upon being subjected to changes in temperature.

22 Claims, 3 Drawing Sheets

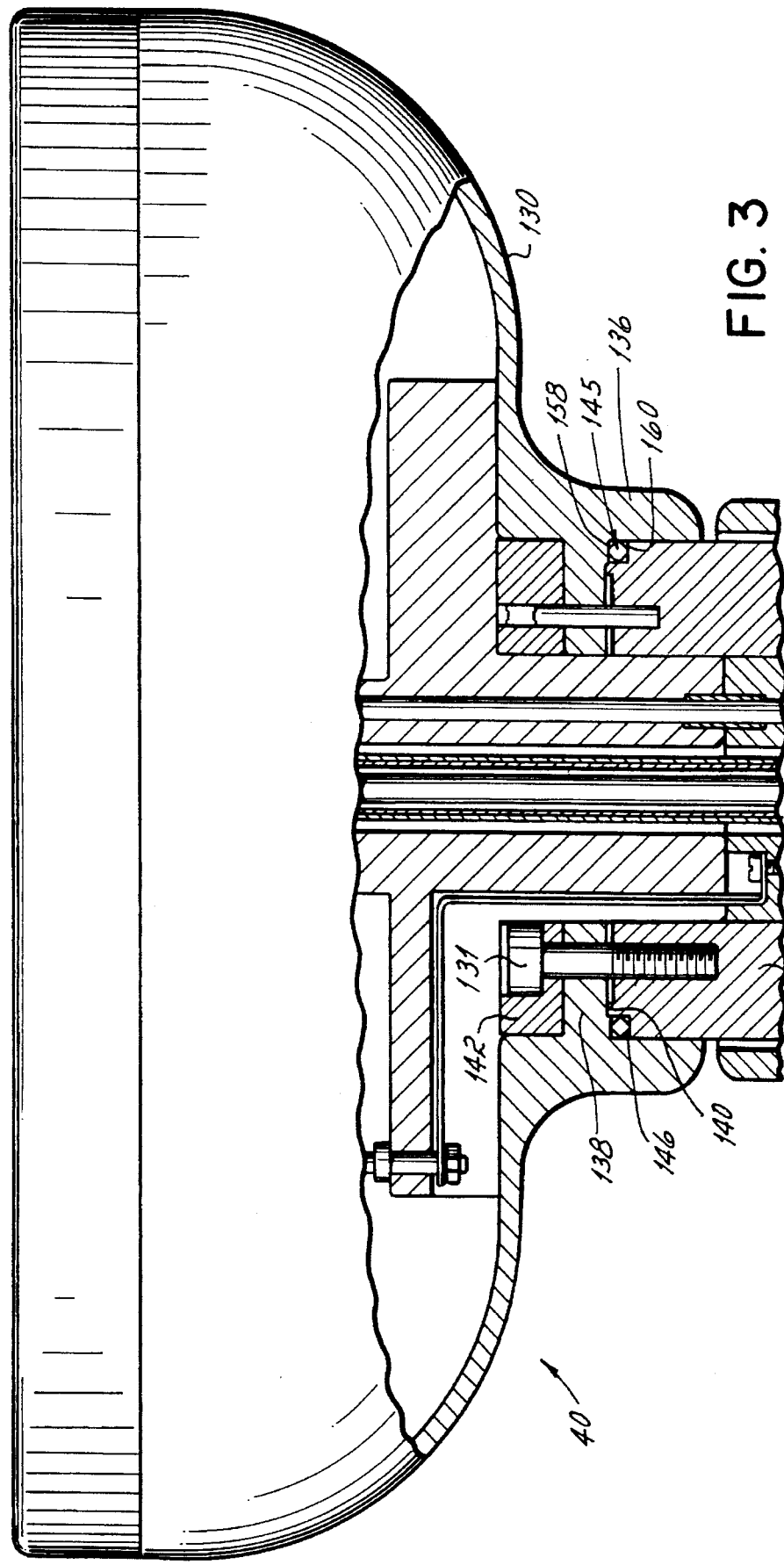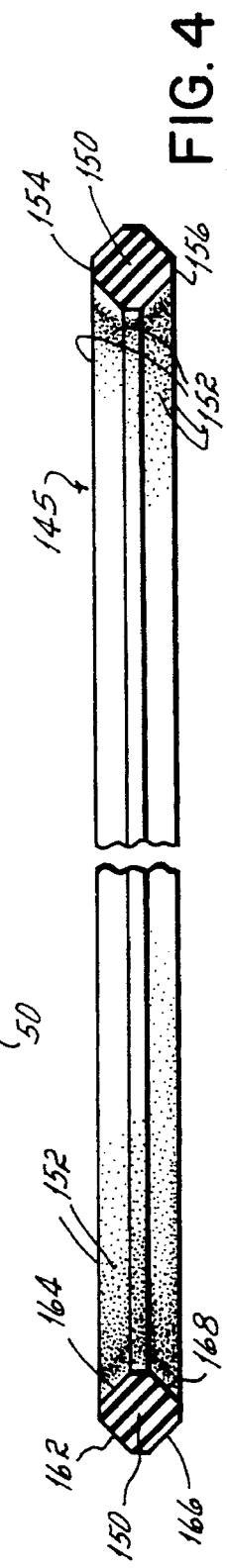

THERMAL CYCLE RESISTANT SEAL AND METHOD OF SEALING FOR USE WITH SEMICONDUCTOR WAFER PROCESSING APPARATUS

FIELD OF THE INVENTION

This application relates generally to semiconductor wafer processing apparatus, and more particularly to a seal and method of sealing for use with a chemical vapor deposition ("CVD") reactor apparatus for coating semiconductor wafers, which seal and sealing method are operable to prevent gas flow between two volumes separated by the seal and which retains its sealing capability over a number of thermal cycles.

BACKGROUND OF THE INVENTION

Semiconductor wafers are subject to a variety of processing steps in the course of the manufacture of semiconductor devices. The processing steps are usually carried out in sealed vacuum chambers of wafer processing machines. Many of the processes performed on the wafers in such chambers involve the heating either of the wafers or of some component involved in the process. As a result of the heating, thermal expansion, including unequal thermal expansion, of parts of the wafer processing machine is encountered.

CVD processes such as those for application of tungsten coatings to semiconductor wafers are typically performed in cold wall reactors, where the waters to be coated are heated to a reaction temperature on a susceptor while other surfaces of the reactor are maintained at subreaction temperatures to prevent the deposition of films thereon. For tungsten CVD, for example, reactor walls are often cooled, often to about room temperature. Alternatively, for titanium nitride CVD, the walls may be heated above room temperature, but to a temperature below that of the substrate being treated.

In a CVD wafer processing machine, the reactor includes a susceptor rotating and wafer elevating mechanism. Evacuation of the reactor is accomplished via a vacuum pump assembly to maintain the reactor at the required operating pressure levels. A resistance heater is mounted in the susceptor for heating the susceptor and hence wafers to the desired operation temperature.

The CVD reactor has a housing which seals within it the reaction chamber. The housing includes provision for independent temperature control, both for heating and cooling of the reactor wall. A mixing chamber is located at the top of the reaction chamber, and reactant gas flows from a showerhead downwardly to blanket the wafers supported on the susceptor.

The semiconductor wafer supporting susceptor provided within the chamber has fixed to its bottom a susceptor drive support frame. Rotatably mounted within the drive support frame is a hollow susceptor drive shaft. The hollow susceptor drive shaft is rigidly connected to the bottom of the susceptor. The hollow space within the drive shaft communicates with the interior of the susceptor within the reaction chamber. The vacuum pressure within the hollow drive shaft is maintained at a pressure sufficiently lower than that of the chamber to develop a vacuum within the susceptor to operate as a vacuum chuck to hold a wafer against the susceptor during processing. Alternatively, if vacuum clamping is not used, the hollow space within the susceptor drive shaft is maintained at a pressure that will develop a vacuum in the susceptor that is equal to or slightly greater than the pressure in the chamber thereby preventing entry of reactant gases into the susceptor.

A seal is therefore provided at the junction or interface between the susceptor drive shaft and the susceptor to prevent fluid communication between the reaction chamber and the interior of the susceptor drive shaft.

The seal between the susceptor drive shaft and the susceptor is subject to thermal cycling during the semiconductor wafer processing steps. For example, during the production of semiconductor wafers, the susceptor may be heated to approximately 400° to 500° C., at a pressure of from 1 to 100 Torr within the reaction chamber.

At the temperature ranges noted above, metallic seals must ordinarily be used since the operating temperatures exceed the levels at which elastomeric seal materials can survive. Metallic seal materials are inherently less elastic than elastomeric materials, however, and require better control of the gland sealing face separation distance. Unfortunately, thermal cycling often causes the gland sealing face separation distance to change beyond the capacity of the metal seal's elasticity.

The present state of the art relies upon metallic seal assemblies and attempts are made to construct them to have enough elasticity to accommodate the gland seal face separation distance to maintain a leak tight seal. This is sometimes difficult to accomplish, however, because seals must often be small in size leaving very little material with which to provide sufficient elasticity.

Accordingly, there is a need for improvement in sealing between components of wafer processing apparatus which are subjected to thermal cycling at temperatures above acceptable levels for elastomeric materials and which are able to compensate for and thus retain sealing capability during and subsequent to variations in separation distance between gland sealing face surfaces.

SUMMARY OF THE INVENTION

It has been a primary objective of the present invention to provide a seal and method of sealing for use with wafer processing apparatus which can insure sealing capability even when subjected to repeated thermal cycling.

In accordance with the principles of the present invention, semiconductor wafer production apparatus may include one or more pairs of confronting sealing surfaces. A seal according to the principles of the present invention for preventing gas flow between the surfaces and which retains its sealing capability upon being subjected to changes in temperature is provided. Such confronting sealing surfaces are found, for example, at the susceptor to drive shaft interface in a CVD reactor apparatus for coating semiconductor wafers.

The seal of the present invention comprises a rigid core, and a ductile coating on the core. The rigid core and the ductile coating are both preferably metallic, with the rigid core preferably being stainless steel and the ductile coating preferably being silver.

The cross-section of the seal is preferably generally diamond-shaped. The diamond-shaped cross-section includes upper and lower blunt tips. Clamping elements, for example bolts, are provided for clamping the seal between the sealing surfaces. The force generated by the bolts in combination with the geometry of the upper and lower blunt tips of the seal cross-section develops a contact stress in the ductile coating sufficient to plasticly deform the ductile coating to accommodate surface imperfections on the sealing surfaces but insufficient to cause ultimate failure of the ductile coating.

The seal core cross-section preferably has a dimension parallel a seal longitudinal axis of symetry of about 0.105 to 0.107 in., and a dimension transverse to the seal longitudinal axis of symetry of about 0.110 in. The upper and lower blunt tips of the seal core preferably have a dimension transverse to the seal longitudinal axis of symmetry of about 0.012 in. The seal core cross-section preferably includes four angled seal cross-sectional faces each of which forms an angle of about 50° with respect to the seal longitudinal axis of symetry. The thickness of the ductile core coating is preferably about 0.003 to 0.005 in.

The present invention relies upon the seal clamping elements (bolts) to provide the necessary elasticity to maintain contact at the gland sealing faces. This is advantageous because the clamping elements can generally be larger and thus have a lower spring rate and a better ability to accommodate larger changes in the seal face separation distance. Accordingly, the seal itself, and not the gland, is designed to control the gland seal faces at all times. Thus, as the clamping elements maintain sufficient contact at the gland sealing faces, the seal will remain leak tight.

A primary advantage of the present invention is that a seal and method of sealing are provided for use with semiconductor wafer processing apparatus, the sealing integrity of which is not compromised due to thermal cycling.

These and other objects and advantages of the present invention will become more readily apparent during the following detailed description taken in conjunction with the drawings herein, in which:

BRIEF DESCRIPTION OF THE DRAWINGS

FIG. 3 is a view of the susceptor of FIGS. 1 and 2, in partial cross-section; and FIG. 4 is an enlarged view of the seal disposed between the susceptor and susceptor drive shaft according to the principles of the present invention.

DETAILED DESCRIPTION OF THE INVENTION

Figure 1:
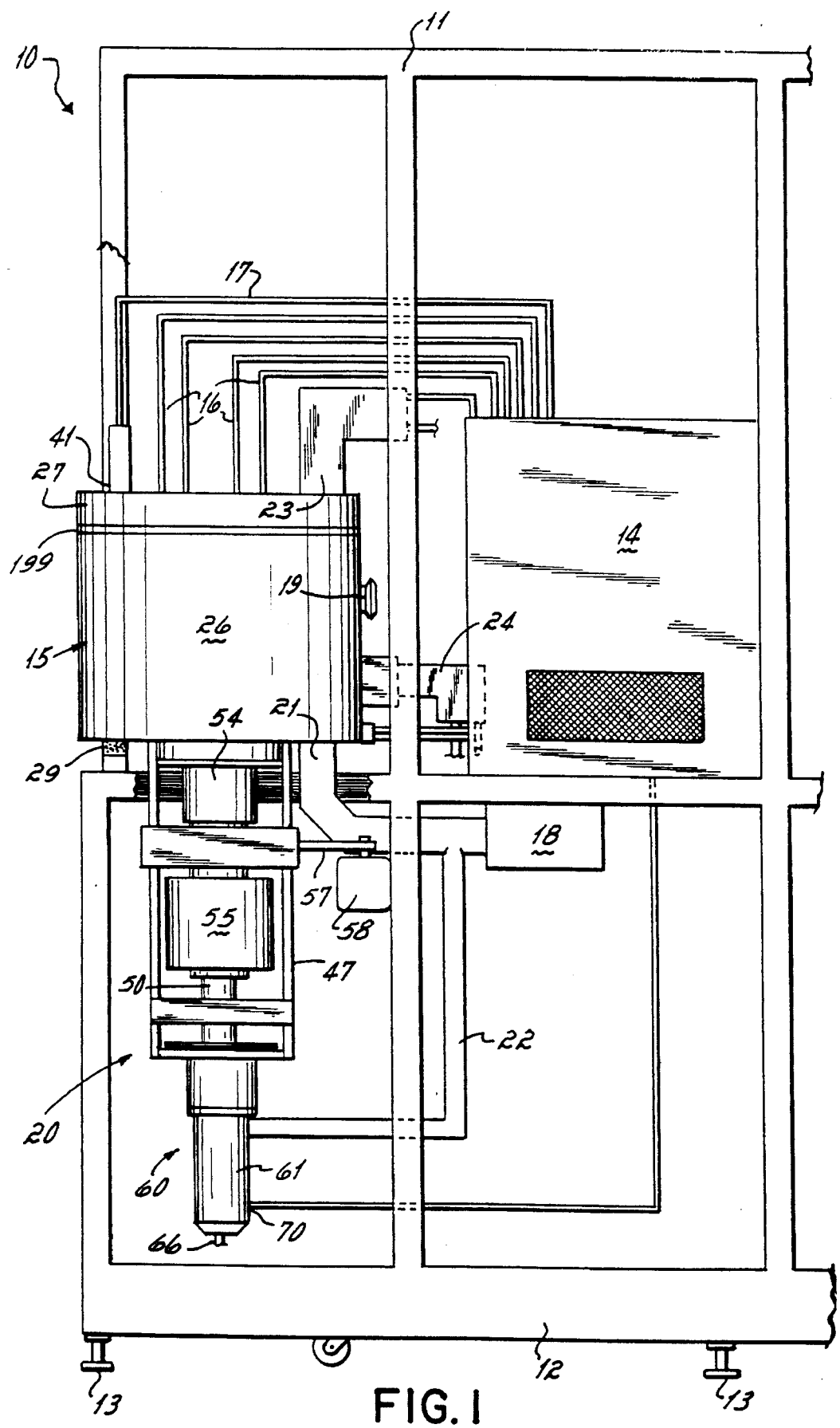
FIG. 1 is an elevational view of a CVD module for a wafer processing cluster tool embodying the principles of the present invention.

FIG. 1 illustrates a CVD module 10 for a wafer processing cluster tool. Module 10 is the same as that shown in U.S. Pat. No. 5,273,588 issued on Dec. 28, 1993 and assigned to the assignee of the present invention, the entire disclosure of which is hereby incorporated by reference herein as if fully set forth in its entirety. The module 10 includes a frame 11 on a wheeled base 12, which has depending therefrom a set of adjustable feet 13 for leveling the module 10 and anchoring the module 10 to a floor. The module 10 includes a cabinet 14 fixed to the frame 11 that contains flow controllers with connections for inlet lines for supplying reactant gases to a chemical vapor deposition (CVD) reactor 15, also fixed to the frame 11. The cabinet 14 has associated with it other parts of the reactor support system that are not shown, including fluid conduits, valves, pumps, controls, and associated hardware for the operation of the reactor 15 including the supplies and connections to supplies of the various reactant gases, inert gases, purging and cleaning gases, and cooling fluids for the reactor 15.

The reactant gases for the main CVD process to be performed with the reactor 15 are gases used for a blanket tungsten deposition process onto silicon semiconductor wafers and are supplied through lines 16, shown as four in number, connected between the cabinet 14 and the reactor 15. These gases include, for example, tungsten hexafluoride ($WF_6$), hydrogen ($H_2$), and silane ($SiH_4$). The reactor is, however, also useful for titanium nitride films and for many other films that can be applied through a CVD process. Also supplied through one of the lines 16 may be inert gas such as argon. In addition, reactant gas for the plasma cleaning of the chamber 15, such as nitrogen trifluoride ($NF_3$) gas, is supplied through a gas inlet line 17 connected between the cabinet 14 and the reactor 15. The module 10 also includes one or more vacuum pumps 18, and usually one high volume low vacuum pump and one low volume high vacuum pump, for evacuating the reactor 15, for maintaining a vacuum within the reactor 15 at the required operating pressure levels, and for exhausting unused reactant gas, reaction byproducts, cleaning gases and inert gases flowing through the reactor. A residual gas analyzer port 19 is provided for monitoring the constituents of the gas.

The reactor 15 includes a susceptor rotating and wafer elevating mechanism 20 depending from the bottom of the reactor 15. The main evacuation of the reactor 15 is accomplished through a vacuum outlet line 21 connected between the reactor 15 and the vacuum pump or pump assembly 18 while one or more auxiliary vacuum outlet lines 22 are provided, connected between the mechanism 20 and the pump assembly 18. A combined upper electrode electrical terminal and cooling fluid manifold connector 23 and a combined lower electrode electrical terminal and cleaning gas connector 24 are also connected between the reactor 15 and the support systems in the vicinity of cabinet 14.

Figure 2:
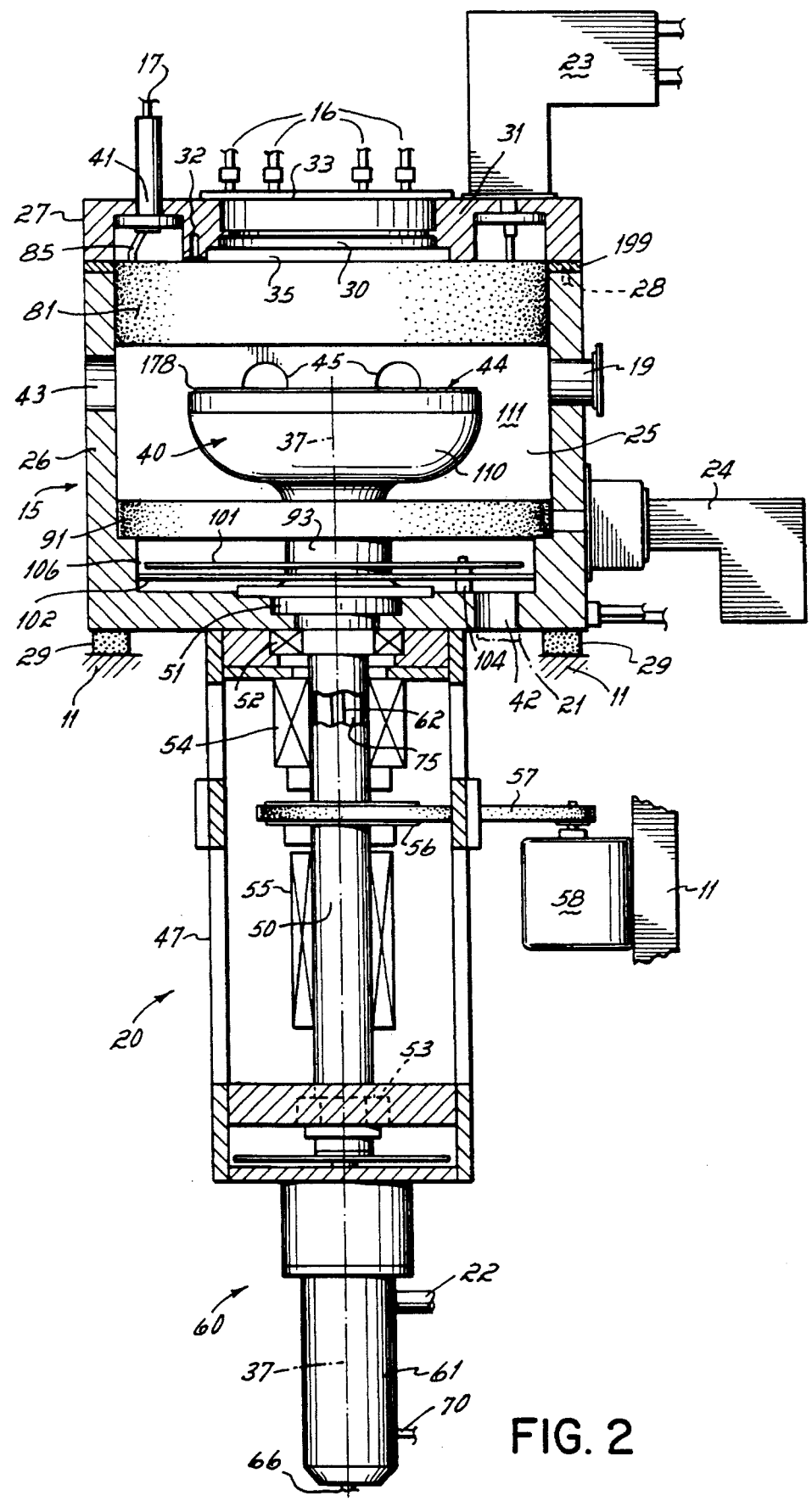
FIG. 2 is a cross-sectional view of a CVD reactor of the module of FIG. 1.

Referring to FIG. 2, the CVD reactor 15 has sealed within it a reaction chamber 25 enclosed in a housing 26 by which the reactor 15 is mounted through rubber vibration absorbing pads 29 to the frame 11 and from the bottom of which the mechanism 20 is supported. The housing 26 is preferably made of aluminum with a highly polished interior, and is provided with independent temperature control, both for heating and cooling of the reactor wall, to produce what is sometimes generically referred to as a cold wall reactor, as distinguished from an oven type reactor in which the susceptor is heated by radiant heat from a heated reactor wall. The housing 26 is preferably fluid cooled, by a suitable fluid such as ethylene glycol or water. In addition, resistance heating elements (not shown) are also provided in the housing 26 so that the housing may be heated, or, alternatively or in addition, rod type heating elements may be provided in the chamber at various locations. One or more of the heating or cooling features may be employed in the same structure, depending on its intended applications. The heating and cooling of the reactor wall may be zone controlled, and may have both the heating and cooling active simultaneously for more responsive temperature regulation and uniformity.

The housing 26 has, at the top thereof, a chamber cover 27, preferably also of aluminum, enclosing the reaction chamber 25 within. The cover 27 is pneumatically sealed against the top of the housing 26, or spacers 199 if employed, and may be pneumatically held thereto or may be mechanically secured thereto by screws 28 or clamps. In FIG. 2, the screws 28 are shown securing spacers 199 to the top of the housing 26. The cover 27 has a reactant gas mixing chamber 30 surrounded by an annular mixing chamber wall which may be formed integrally of the aluminum chamber cover 27 or of a separate material such as a machinable ceramic or separate aluminum or other metal piece and secured to the underside of the chamber cover 27. The mixing chamber wall 31 is capable of being actively cooled, where the proess, for example a tungsten deposition process, so requires, by cooling fluid supplied to flow through an annular passage 32 formed in the wall 31 to maintain it at a temperature lower than the reaction temperature that is independent of that of the housing 26 and that of the chamber cover 27. Like the housing 26, the mixing chamber wall 31 is also provided with resistance heating elements (not shown) to heat the wall and the mixing chamber 30 where the process so requires, such as for titanium nitride deposition. This annular wall 31 may be made of a thermally nonconductive material or of a conductive material thermally insulated from the aluminum material of the cover 27 to provide greater flexibility in the control of its temperature. The upper portion of the mixing chamber 30 is closed by a removable cover or top plate 33, preferably of stainless steel, which is sealably connected to the chamber cover 27 by bolts (not shown). The chamber housing 26, chamber cover 27 and top plate 33 form a sealed vessel enclosing an internal volume that is maintained at a vacuum pressure level during operation of the module 10.

The bottom of the gas mixing chamber 30 is closed by a circular showerhead 35 connected to the bottom of the mixing chamber wall 31. The showerhead 35 may be made of aluminum or of a machinable ceramic material and has a highly polished lower surface to retard the absorption of radiant heat from the higher reaction temperature from the area of a wafer being processed within the chamber 25. The showerhead 35 may have a uniform pattern of holes therethrough (not shown), preferably arranged in a matrix or an array in plural concentric circles about the center thereof, which lies on a vertical axis 37 through the reactor 15. Alternatively, the showerhead 35 may be formed of a porous metal or ceramic plate.

A plurality of gas inlet ports (not shown) are provided in the top plate 33 to which the gas lines 16 are connected. A rotary wafer supporting susceptor 40 is provided within the chamber 25. The susceptor 40 lies on the axis 37 directly beneath the showerhead 35 and is in axial alignment therewith. A cleaning gas entry port 41 is mounted to the chamber cover 27 and is connected to the cleaning gas input line 17. The RF upper electrode terminal and cooling water connector 23 is also mounted to the chamber cover 27. The lower electrode RF terminal and cleaning gas connector 24 are mounted to the side wall of the housing 26. A single vacuum outlet port 42 is provided in the bottom of the chamber housing 26 to which the vacuum outlet line 21 is connected to the pump 18, which operates at a pumping rate of from 400–500 liters per second to achieve the wafer processing pressures at between 1 and 100 Torr, reactor cleaning pressures of from 0.1 to 100 m Torr, and wafer transfer pressures of $10^{-4}$ Torr within the chamber 25. A gate port 43 is provided in the forward wall of the housing 26 for connection to a transport module or wafer handling module of a cluster tool, to and from which wafers are loaded and unloaded of chambers 25 for processing. The gate 43 is approximately in horizontal alignment with an upwardly facing wafer supporting top surface 44 of the susceptor 40 whereupon a wafer is supported for processing with its upwardly facing side disposed horizontally parallel to and in vertical alignment with the showerhead 35. A plurality of ports 45 are provided in horizontal alignment with the wafer support surface 44 or the housing 26 on opposite sides of the reaction chamber 25 for inserting diagnostic or other instrumentation.

Fixed to the bottom of the housing 26 and aligned with the reactor axis 37 is a susceptor drive support frame 47. Rotatably mounted within the drive support frame 47 is a hollow and circular in cross-section susceptor drive shaft 50. The drive shaft 50 is mounted to rotate on its axis, which is on the reactor axis 37, extends through a hole 51 in the bottom of the reactor housing 26, and is rigidly connected to the bottom of the susceptor 40. At the hole 51, the shaft 50 is rotatably supported on a main bearing 52 having its inner race surrounding the shaft 50 in tight contact therewith and its outer race fixed to the frame 47 at the bottom of the housing 26. A secondary bearing 53, connected to the lower end of the frame 47, tightly surrounds and supports the lower end of the drive shaft 50. Secured to the support frame 47 immediately below the bearing 52 and tightly surrounding the shaft 50 is a ferrofluidic seal 54. The ferrofluidic seal 54 has fluid circulated through it at a temperature of less than 70° C. to prevent the ferrofluid within it from decomposing and losing its magnetic properties due to heat from the shaft 50. Above the secondary bearing 53 within the frame 47 and also surrounding the shaft 50 is an electrical slip ring connector 55. The slip ring 55 provides electrical connection with the rotating shaft 50 to supply electrical energy to the rotating susceptor and receives sensed temperature signals therefrom. Fixed to the shaft 50 between the seal 54 and the slip ring 55 is a drive pulley 56 which is drivably connected through a drive belt 57 with the output of a susceptor rotation drive motor 58.

At the lower end of the rotating and elevating mechanism 20, fixed to the bottom of the frame 47, is a wafer lift mechanism 60. The lift mechanism 60 includes an outer fluid-tight shell 61 with a hollow interior enclosing the lower end of a hollow and vertical lift tube 62. The tube 62 extends vertically from the lift mechanism 60 upwardly through the frame 47 and through the hollow interior of the drive shaft 50, along the axis 37 of the reactor, and into the chamber 25, terminating in the interior of the susceptor 40. The tube 62 rotates with the drive shaft 50 and slides axially therein a distance of approximately nine millimeters to raise and lower a wafer on the wafer support surface 44 of the susceptor 40 in the reaction chamber 25. A source of helium gas (not shown) is connected to a helium gas inlet port 70 at the bottom of the shell 61 of the lift mechanism 60. The inlet port 70 communicates with a helium inlet channel (not shown) at the base of a hub piece (not shown) to which the lower end of tube 62 is fixed, which communicates through the hollow interior thereof with an axial bore of the tube 62, extending the length thereof, to communicate with the channel 176. Additional details of wafer lift mechanism 60 may be seen with reference to U.S. Pat. No. 5,273,588.

A vacuum outlet port (not shown) is provided in the shell 61 and connects with an elongated hollow tube (not shown) to apply vacuum in a hollow space 75 within the drive shaft 50 at the upper end thereof surrounding the tube 62. The hollow space 75 extends the length of the drive shaft 50 and also communicates with the interior of the susceptor 40 within the reaction chamber 25. The vacuum pressure at the vacuum outlet port may be maintained at a pressure sufficiently lower than that of the chamber 25 to develop a vacuum in the susceptor 40 to operate as a vacuum chuck to hold a wafer against the susceptor surface 44 during processing. This vacuum clamping pressure is communicated between the vacuum port and the space 75 at the top of the drive shaft 50 through an annular column (not shown) that surrounds the tube 62 and lies within the elongated hollow tube. If vacuum clamping is not used, the vacuum at the vacuum inlet port is maintained at a pressure that will develop a vacuum in the susceptor 40 that is equal to or slightly greater than the pressure in the chamber 25. In this way, the entry of reactant gases into the susceptor is prevented.

Referring now to FIGS. 3, susceptor 40 is provided with a thin outer metal wall 130 which is mounted by bolts 131 to the top of the drive shaft 50. At the base of the susceptor wall 130, formed integrally therewith, is a downwardly extending circular collar 136 which surrounds the shaft 50. Projecting inwardly from the collar 136 and formed integrally with the wall 130 is a circular susceptor mounting flange 138. At the upper end of the shaft 50 is an annular upwardly projecting shoulder 140 on which the flange 138, and thus the wall 130, is supported to thereby support the susceptor 40 for rotation with the shaft 50. Bolts 131, which are threaded into the top of the shaft 50, extend through a disk 142. A seal 145 according to the present invention is provided in an annular space or sealing zone 146 formed around the outside of the upper end of the shaft 50 between the shaft 50 and the collar 136 and the flange 138 of the susceptor wall 130.

Referring now to FIG. 4, a sealing element or seal 145 is shown enlarged. Seal 145 is circular in the form of a ring and includes a rigid metallic core 150 and a ductile metallic coating 152 on the core 150. Preferably the rigid metallic core 150 is stainless steel, and the ductile metallic coating 152 is silver. As is seen in FIG. 4, the cross-section of the seal 145 is generally diamond-shaped. This diamond-shaped seal cross-section has upper and lower blunt tips 154 and 156, respectively. The clamping force generated by bolts 131, preferably stainless steel bolts, of the flange 138, or upper gland, and the shaft 50, or lower gland, on the seal 145 preferably develops a contact stress in the ductile coating 152 sufficient to plasticly deform the ductile coating 152 to accommodate surface imperfections on the susceptor and shaft sealing surfaces 158 and 160, respectively, but insufficient to cause ultimate failure of the ductile coating 152.

In the preferred form of the seal 145 of the present invention, the core 150 has the following dimensions prior to being coated by coating 152: The seal core cross-section has a dimension parallel the seal longitudinal axis of symetry of about 0.105 to about 0.107 in. Further, the seal core has an inner diameter of about 2.645 in., and an outer diameter of about 2.865 in., and therefore the seal core cross-section has a dimension transverse the seal longitudinal axis of symmetry of about 0.110 in. Measuring from the radially innermost edge of the blunt tips, the seal core cross-section has a diameter of about 2,743 in., and measuring from the radially outermost edge of the blunt tips the seal core cross-section has a diameter of about 2.767 in. Thus, the upper and lower blunt tips 154, 156 of the seal core cross-section have a dimension transverse the seal longitudinal axis of about 0.012 in. The seal core cross-section includes four angled seal cross-section faces 162, 164, 166 and 168 each of which forms an angle of about 50° with respect to the seal longitudinal axis of symmetry. The metallic ductile coating 152 applied to core 150 preferably has a thickness of about 0.003 to about 0.005 in.

The stainless steel utilized in core 150 is *preferably 17–4 stainless steel heat treated to condition H-1100. The abovementioned dimensional limits apply prior to silver plating of the seal 145. The silver plating is to be applied per QQ-S-365 (fully annealed) to a thickness of, as specified above, about 0.003 to about 0.005 in. and uniform within 0.001 in. After plating, the seal 145 is to be baked to 375° F. for three hours to remove hydrogen embrittlement from the plating. After plating, the dimension of the seal cross-section parallel the seal longitudinal axis of symmetry should be within about 0.111 in. to about 0.117 in.

The sealing methodology of the present invention maintains a leak tight seal after repeated thermal cycling. The seal of the present invention has successfully operated at 510° C. through two thermal cycles with no signs of leakage. The seal of the present invention therefore is constructed of a rigid metallic core material with a ductile coating that will plasticly deform to accommodate the surface imperfections that exist on the sealing faces of the gland. The dimensions of the core material and ductile coating must be large enough to ensure that the total seal thickness, and nothing else, controls the separation distance between the sealing faces of the gland. Furthermore the seal clamping elements (typically bolts) must provide sufficient elasticity at the operating temperatures to accommodate any thermally induced dimensional changes and maintain sufficient contact pressure at the sealing faces of the gland at all times.

The core material dimension is set to be large enough to control the gland sealing face separation distance thus insuring that the ductile overcoating is always in contact with the gland sealing faces. The overcoating ductile metal is applied to the rigid core to a thickness which is sufficient to accommodate surface imperfections on the gland sealing faces but not so thick that compression or relaxation of the coating affects the gland sealing face separation distance. The cross-section of the seal core is designed to minimize the contact area between the ductile material and gland sealing faces to, in turn, maximize the contact stress there and help insure a leak tight condition.

The material of the clamping elements, glands and seal core are selected to provide the correct combinations of coefficient of thermal expansion to minimize the change in the gland seal face separation distance throughout the operating temperature range. The susceptor shaft is preferably fabricated of 17–4 PH stainless steel, and the susceptor is preferably fabricated of Monel 400, a copper and nickel based alloy. The clamping element material and design are selected to allow the elements to maintain clamping of the gland seal faces throughout the operating temperature range.

Those skilled in the art will readily recognize numerous adaptations and modifications which can be made to the thermal cycle resistant seal of the present invention which will result in an improved seal, yet all of which will fall within the spirit and scope of the present invention as defined in the following claims. Accordingly, the invention is to be limited only by the scope of the following claims and their equivalents.

What is claimed is:

1. Semiconductor wafer processing apparatus comprising:

a wafer supporting susceptor having a sealing surface;

a susceptor drive shaft for connection to said susceptor and having a sealing surface;

a ring-shaped seal disposed between said susceptor sealing surface and said drive shaft sealing surface having a metallic core of a first hardness and a metallic coating of a second hardness on said core, said first hardness being greater than said second hardness; and fasteners connecting said susceptor to said drive shaft and compressing said seal between said susceptor and drive shaft sealing surfaces;

said seal retaining sealing capability upon being subjected to changes in temperature;

said seal having a generally diamond-shaped cross-section having upper and lower blunt tips;

said drive shaft and said seal core being fabricated from material having the same coefficient of thermal expansion.

2. The apparatus of claim 1 wherein said core is stainless steel and said coating is silver.

3. The apparatus of claim 1 wherein said core of said seal has a dimension parallel a seal longitudinal axis of symmetry of about 0.105 to 0.107 in.

4. The apparatus of claim 1 wherein said core of said seal has a dimension transverse a seal longitudinal axis of symmetry of about 0.110 in.

5. The apparatus of claim 1 wherein said upper and lower blunt tips of said core of said seal have a dimension transverse a seal longitudinal axis of symmetry of about 0.012 in.

6. The apparatus of claim 1 wherein said core of said seal includes four angled faces each of which forms an angle of about 50° with respect to a seal longitudinal axis of symmetry.

7. The apparatus of claim 1 wherein said core coating has a thickness of about 0.003 to 0.005 in.

8. For a semiconductor wafer production apparatus having a wafer supporting susceptor and a drive shaft for driving the susceptor, the susceptor and drive shaft having respective confronting sealing surfaces, a method of preventing gas flow between the susceptor sealing surface and the drive shaft sealing surface comprising the steps of:

providing a sealing zone defined by the susceptor sealing surface and the drive shaft sealing surface;

placing a ring-shaped sealing element in the sealing zone, the ring-shaped sealing element having a core of a first hardness and a coating of a second hardness on the core, the first hardness being greater than the second hardness, the drive shaft and the seal core being fabricated from materials having the same coefficient of thermal expansion; and clamping the sealing element between the susceptor sealing surface and the drive shaft sealing surface in the sealing zone with clamping elements.

9. The method of claim 8 wherein the core is metallic and the coating is metallic.

10. The method of claim 9 wherein the core is stainless steel and the coating is silver.

11. The method of claim 8 wherein the sealing element has a generally diamond-shaped cross section.

12. The method of claim 11 wherein the diamond-shaped sealing element cross-section has upper and lower blunt tips.

13. The method of claim 12 wherein the clamping step includes generating a sufficient force with the clamping elements which, in combination with the geometry of the upper and lower blunt tips, develops a contact stress in the coating sufficient to plastically deform the coating to accommodate surface imperfections on the susceptor sealing surface and shaft sealing surface but insufficient to cause ultimate failure of the coating.

14. The method of claim 12 wherein the core has a dimension transverse a sealing element longitudinal axis of symmetry of about 0.110 in.

15. The method of claim 12 wherein the upper and lower blunt tips of the core have a dimension transverse a sealing element longitudinal axis of symmetry of about 0.012 in.

16. The method of claim 12 wherein the core includes four angled faces each of which forms an angle at about 50° with respect to a sealing element longitudinal axis of symmetry.

17. The method of claim 12 wherein the core coating has a thickness of about 0.003 to 0.005 in.

18. The method of claim 11 wherein the core has a dimension parallel a sealing element longitudinal axis of symmetry of about 0.105 to 0.107 in.

19. Semiconductor wafer processing apparatus comprising:

a wafer supporting susceptor having a sealing surface;

a susceptor drive shaft for connection to said susceptor and having a sealing surface;

a ring-shaped seal disposed between said susceptor sealing surface and said drive shaft sealing surface having a metallic core of a first hardness and a metallic coating of a second hardness on said core, said first hardness being greater than said second hardness; and fasteners connecting said susceptor to said drive shaft and compressing said seal between said susceptor and drive shaft sealing surfaces;

said seal retaining sealing capability upon being subjected to changes in temperature;

said drive shaft and said seal core being fabricated from materials having the same coefficient of thermal expansion.

20. The semiconductor wafer processing apparatus of claim 19 wherein said drive shaft and said seal core are fabricated from the same material.

21. The semiconductor wafer processing apparatus of claim 20 wherein said same material is stainless steel.

22. The semiconductor wafer processing apparatus of claim 21 wherein said seal coating is silver.

\* \* \* \* \*